US010343907B2

(12) United States Patent
Jongbloed et al.

(10) Patent No.: US 10,343,907 B2
(45) Date of Patent: Jul. 9, 2019

(54) METHOD AND SYSTEM FOR DELIVERING HYDROGEN PEROXIDE TO A SEMICONDUCTOR PROCESSING CHAMBER

(71) Applicant: ASM IP Holding B.V., Almere (NL)

(72) Inventors: Bert Jongbloed, Oud-Heverlee (BE); Dieter Pierreux, Dilbeek (BE); Cornelius A. van der Jeugd, Heverlee (BE); Lucian Jdira, Nieuw Vennep (NL); Radko G. Bankras, Almere (NL); Theodorus G. M. Oosterlaken, Oudewater (NL)

(73) Assignee: ASM IP Holding B.V., Almere (NL)

( * ) Notice: Subject to any disclaimer, the term of this patent is extended or adjusted under 35 U.S.C. 154(b) by 113 days.

(21) Appl. No.: 14/660,789

(22) Filed: Mar. 17, 2015

(65) Prior Publication Data

US 2015/0279693 A1 Oct. 1, 2015

Related U.S. Application Data

(60) Provisional application No. 61/972,005, filed on Mar. 28, 2014.

(51) Int. Cl.
*H01L 21/02* (2006.01)
*C01B 15/017* (2006.01)
*H01L 21/67* (2006.01)

(52) U.S. Cl.
CPC ...... *C01B 15/017* (2013.01); *H01L 21/67017* (2013.01)

(58) Field of Classification Search
CPC .......... H01L 21/67017; C01B 15/017
(Continued)

(56) References Cited

U.S. PATENT DOCUMENTS 2,491,732 A * 12/1949 Hawkinson ........... C01B 15/013
159/48.2
5,242,468 A * 9/1993 Clark ................ H01L 21/67023
134/102.2
(Continued)

FOREIGN PATENT DOCUMENTS

JP 02-099831 4/1990
JP 02-161726 6/1990
(Continued)

OTHER PUBLICATIONS

JPH02161726A with machine translation (Year: 1990).*
(Continued)

*Primary Examiner* — Michael E Barr
*Assistant Examiner* — Tinsae B Ayalew
(74) *Attorney, Agent, or Firm* — Knobbe Martens Olson & Bear

(57) ABSTRACT

In some embodiments, a system is disclosed for delivering hydrogen peroxide to a semiconductor processing chamber. The system includes a process canister for holding a $H_2O_2/H_2O$ mixture in a liquid state, an evaporator provided with an evaporator heater, a first feed line for feeding the liquid $H_2O_2/H_2O$ mixture to the evaporator, and a second feed line for feeding the evaporated $H_2O_2/H_2O$ mixture to the processing chamber, the second feed line provided with a second feed line heater. The evaporator heater is configured to heat the evaporator to a temperature lower than 120° C. and the second feed line heater is configured to heat the feed line to a temperature equal to or higher than the temperature of the evaporator.

11 Claims, 1 Drawing Sheet

(58) Field of Classification Search
USPC .......................................................... 134/105
See application file for complete search history.

(56) References Cited

U.S. PATENT DOCUMENTS

| | | | |
|---|---|---|---|
| 5,608,156 A * | 3/1997 | Ando | G01D 3/022 |
| | | | 422/83 |
| 5,874,367 A | 2/1999 | Dobson | |
| 6,007,675 A * | 12/1999 | Toshima | C23C 16/54 |
| | | | 118/716 |
| 6,189,368 B1 | 2/2001 | Ichida et al. | |
| 6,492,283 B2 | 12/2002 | Raaijmakers et al. | |
| 6,562,735 B1 | 5/2003 | Allman et al. | |
| 6,984,360 B1 * | 1/2006 | Bernard et al. | A61L 2/208 |
| | | | 141/6 |
| 7,501,292 B2 | 3/2009 | Matsushita et al. | |
| 7,622,369 B1 | 11/2009 | Lee et al. | |
| 7,651,959 B2 | 1/2010 | Fukazawa et al. | |
| 7,718,553 B2 | 5/2010 | Fukazawa et al. | |
| 7,781,352 B2 | 8/2010 | Fukazawa et al. | |
| 8,007,865 B2 | 8/2011 | Delabie et al. | |
| 8,445,078 B2 | 5/2013 | Liang et al. | |
| 9,190,299 B2 | 11/2015 | Wada et al. | |
| 2001/0031562 A1 | 10/2001 | Raaijmakers et al. | |
| 2002/0196591 A1 | 12/2002 | Hujanen et al. | |
| 2003/0097884 A1 * | 5/2003 | Sund | G01F 1/8413 |
| | | | 73/861.355 |
| 2003/0161951 A1 | 8/2003 | Yuan et al. | |
| 2003/0230567 A1 * | 12/2003 | Centanni | A61L 2/07 |
| | | | 219/628 |
| 2006/0165904 A1 | 7/2006 | Ohara | |
| 2006/0240677 A1 | 10/2006 | Horii et al. | |
| 2006/0286306 A1 | 12/2006 | Ohara et al. | |
| 2007/0009673 A1 | 1/2007 | Fukazawa et al. | |
| 2008/0220619 A1 | 9/2008 | Matsushita et al. | |
| 2008/0247922 A1 * | 10/2008 | Watling et al. | A61L 2/186 |
| | | | 422/292 |
| 2009/0053906 A1 | 2/2009 | Miya et al. | |
| 2009/0093134 A1 | 4/2009 | Matsushita et al. | |
| 2009/0093135 A1 | 4/2009 | Matsushita et al. | |
| 2009/0305515 A1 | 12/2009 | Ho et al. | |
| 2010/0143609 A1 | 6/2010 | Fukazawa et al. | |
| 2012/0060752 A1 | 3/2012 | Kiyotoshi et al. | |
| 2014/0065841 A1 | 3/2014 | Matero | |
| 2014/0302687 A1 | 10/2014 | Ashihara et al. | |
| 2015/0140835 A1 | 5/2015 | Tateno et al. | |

FOREIGN PATENT DOCUMENTS

| | | |
|---|---|---|
| JP | 07-284739 | 10/1995 |
| JP | 2001-085421 | 3/2001 |
| JP | 2001-230246 | 8/2001 |
| JP | 3-392789 | 3/2003 |
| JP | 2013-142592 | 7/2013 |
| JP | 2013-232624 | 11/2013 |
| WO | WO 2013/077321 A1 | 5/2013 |
| WO | WO 2013/094680 | 6/2013 |
| WO | WO 2013/148262 | 10/2013 |
| WO | WO 2014/014511 | 1/2014 |
| WO | WO 2014/021220 A1 | 2/2014 |

OTHER PUBLICATIONS

WO2013077321A1 with machine translation (Year: 2013).*
Kaufman-Osborn et al. "In-situ non-disruptive cleaning of Ge(100) using $H_2O_2$(g) and atomic hydrogen", Surface Science 630: 254-259, Aug. 2014.
Liu et al. "A Simple Gate-Dielectric Fabrication Process for AlGaN/GaN Metal-Oxide-Semiconductor High-Electron-Mobility Transistors", IEEE Electron Device Letters, vol. 33, No. 7, Jul. 2012.
Office Action dated Jun. 27, 2017 in corresponding Japanese Patent Application No. JP 2015-058314.

* cited by examiner

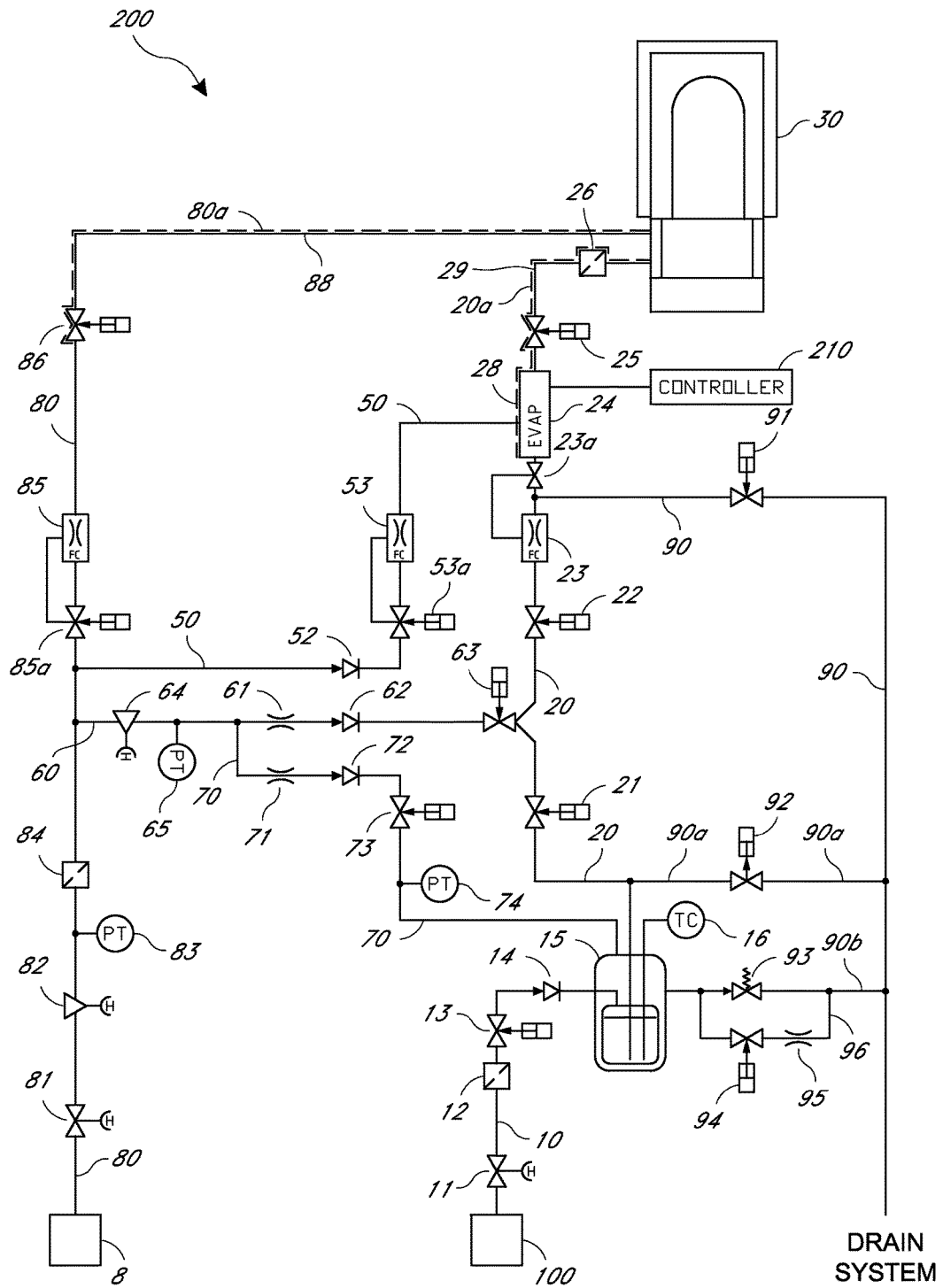

METHOD AND SYSTEM FOR DELIVERING HYDROGEN PEROXIDE TO A SEMICONDUCTOR PROCESSING CHAMBER

PRIORITY CLAIM

This application claims the priority benefit of U.S. Provisional Application Ser. No. 61/972,005, filed Mar. 28, 2014. The full disclosure of this priority application is incorporated herein by reference.

BACKGROUND

Field

The invention relates to semiconductor processing and, more particularly, to semiconductor processing using hydrogen peroxide.

Description of the Related Art

Oxidizing ambients are commonly used in semiconductor processing. For example, oxidizing ambients such as oxygen, steam, or ozone-containing ambients in a semiconductor processing chamber may be used in various processes, such as for curing materials. As processing parameters and materials change, there is a continuing need for the development of processes with oxidizing ambients that meet the challenges presented by the changing parameters and materials.

SUMMARY

In one aspect, a system is provided for delivering hydrogen peroxide to a semiconductor processing chamber. The system includes a process canister for holding a $H_2O_2/H_2O$ mixture in a liquid state; an evaporator provided with an evaporator heater; a first feed line for feeding the liquid $H_2O_2/H_2O$ mixture to the evaporator; and a second feed line for feeding the evaporated $H_2O_2/H_2O$ mixture to the processing chamber. The evaporator heater is configured to heat the evaporator to a temperature lower than 120° C. The second feed line is provided with a second feed line heater configured to heat the feed line to a temperature within 20° C. of the temperature of the evaporator or to a temperature higher than the temperature of the evaporator.

According to another aspect, a method is provided for semiconductor processing. The method includes evaporating an aqueous hydrogen peroxide solution in an evaporator heated to less than 120° C., thereby forming a hydrogen peroxide vapor. The hydrogen peroxide vapor is flowed through a feed line and into a semiconductor processing chamber. A semiconductor substrate in the process chamber is exposed to the hydrogen peroxide vapor.

BRIEF DESCRIPTION OF THE DRAWING

FIG. 1 is a semiconductor processing system, according to some embodiments.

DETAILED DESCRIPTION

Due to various factors, such as compatibility with and guarding against damage to materials on semiconductor substrates, it may be desirable to use low temperatures for processing the semiconductor substrates. For example, it may be beneficial to cure materials at low temperatures. The cure may be performed by exposing the semiconductor substrates to an oxidizing ambient in a semiconductor processing chamber. As temperatures for the curing process decrease, however, the reactivity of oxidizing species in the oxidizing ambient may also decrease.

Hydrogen peroxide, $H_2O_2$, provides a higher effective reactivity than oxygen, steam, or ozone, making it a suitable candidate for use in processes using low temperature oxidizing ambients. $H_2O_2$ is commercially available as an aqueous solution, e.g., at 30 wt. % in $H_2O$.

It has been found, however, that processing results using an aqueous hydrogen peroxide solution can be inconsistent and can have lower reactivity than desired. One approach for delivering $H_2O_2$ to a processing chamber is to evaporate the aqueous hydrogen peroxide solution in a bubbler and to flow a carrier gas through the bubbler, thereby delivering the $H_2O_2$ to the processing chamber with the carrier gas. However, such an approach can lead to inconsistent processing results. Without being limited by theory, it is believed that the $H_2O$ and $H_2O_2$ in the solution evaporate at different rates due to the vapor pressure of $H_2O$ being significantly higher than the vapor pressure of $H_2O_2$. This can cause changes in the concentration of $H_2O_2$ in the solution, with $H_2O$ preferentially evaporating and the concentration of $H_2O_2$ in the bubbler increasing over time. Thus, the amount of $H_2O_2$ delivered to the processing chamber changes over time, making repeatability of the process difficult. In addition, high concentrations of $H_2O_2$ in water are explosive and can be a safety risk, thereby making such a delivery scheme dangerous.

Another proposed approach for delivering $H_2O_2$ to a processing chamber is to flow the aqueous $H_2O_2$ solution through an evaporation chamber. The evaporation chamber is heated to a temperature sufficient to evaporate the $H_2O/H_2O_2$ mixture, which is generally considered to be a temperature above the boiling point of the liquid, 120° C.-130° C. or above. However, it has been found that for evaporator temperatures above 120° C., the ratio of $H_2O_2:H_2O$ in the vapor leaving the evaporator may be significantly lower than the $H_2O_2:H_2O$ ratio in the liquid and the amount of $H_2O_2$ delivered to the processing chamber can be lower than desired, and, as a result, the increased reactivity desired for an $H_2O_2$-containing ambient may be strongly reduced.

Advantageously, according to some embodiments, a consistent concentration of $H_2O_2$ can be delivered to a processing chamber while also providing an oxidizing ambient with high reactivity. In some embodiments, an aqueous $H_2O_2$ solution is turned into a vapor by being heated in an evaporator at a temperature of about 120° C. or less (including less than 120° C.), about 110° C. or less, about 100° C. or less, or about 80° C. or less. In some embodiments, the evaporator is at a temperature of about 120° C. to about 40° C., about 110° C. to about 50° C., about 100° C. to about 50° C., or about 80° C. to about 60° C. The vapor is then flowed into a semiconductor processing chamber, e.g., with a carrier gas, such as an inert carrier gas. The vapor can establish an oxidizing ambient in the processing chamber. Various processes, such as the curing of materials on a semiconductor substrate, may be performed by exposing the substrate in the processing chamber to the oxidizing ambient.

In some implementations, the vapor feed line between the evaporator and the processing chamber may be provided with a heater and heated, e.g., to a temperature equal to or higher than the evaporator. In some embodiments, the vapor feed line may be provided with a filter, which may also be heated, e.g., to a temperature equal to or higher than the evaporator. The filter may have a removal rating of >30 nm, >10 nm, or >3 nm, which means that particles larger than the indicated size are effectively trapped by the filter. The filter may have a pore size of about 5 µm or less, about 1 µm or less, or about 0.5 µm or less. It will be appreciated that the removal rating and the pore size are different parameters, the removal rating reflecting the performance of the filter, and the pore size being a property of the filter medium, although these parameters may influence one another. In some embodiments, a non-thermal flow controller is used to regulate the flow of the aqueous $H_2O_2$ solution to the evaporator.

A semiconductor processing system 200 according to some embodiments will now be discussed with reference to FIG. 1. A process liquid source 100, e.g., a source of a process liquid such as $H_2O_2$, can provide the $H_2O_2$ to a process canister 15 for storing the $H_2O_2$ in the system 200, with the $H_2O_2$ from the canister 15 eventually provided to an evaporator 24, and then to a processing chamber 30. The processing system 200 may be provided with a process controller 210, which may include a computerized system having at least one processor and memory. The computerized system may be in electrical communication with the source of process liquid 100, the process canister 15, the evaporator 24, and/or the processing chamber 30, and may be programmed with instructions to carry out any of the actions noted herein for the processing system 200 and its constituent components. The instructions may be non-transitory instructions stored in the memory accessible by the process controller 210. While shown as a single item for ease of illustration, it will be appreciated that the process controller 210 may include multiple distinct units, each providing instructions to different parts of the system 200.

With continued reference to FIG. 1, a source feed line 10 for feeding the process liquid from the source 100 to the process canister 15 can include a manual shut off valve 11, a filter 12, a pneumatic valve 13, and a check valve 14. As illustrated, just one source 100 and one source feed line 10 to feed a mixture of $H_2O_2/H_2O$ to the canister 15 may be provided. However, a second source of H2O and a second source feed line may be provided to separately feed $H_2O$ to the canister 15 in some embodiments. The canister 15 may be further provided with a temperature sensor 16. The canister 15 holding the liquid $H_2O_2/H_2O$ mixture may be held at room temperature or may be heated above room temperature to a temperature of about 80° C. or below, to facilitate evaporation of the mixture when injected into the evaporator 24.

The process liquid may be transported from the process canister 15 to the evaporator 24 through a first feed line 20. The feed line 20 may further comprise a valve 21, a valve 22, a liquid flow controller 23, and a valve 23a coupled to the flow controller 23. The evaporated process liquid is fed from the evaporator 24 to the processing chamber 30 through a second feed line 20a. The feed line 20a may further comprise a valve 25 and a filter 26. The evaporator 24 may be heated by a heater 28, and the feed line 20a, including the valve 25 and the filter 26, may be heated by a heater 29. In some embodiments, heater 29 heats the vapor feed line 20a, valve 25 and filter 26 to a temperature that is preferably within about 20° C. of the temperature of the evaporator or higher, more preferably to a temperature that is within about 10° C. of the temperature of the evaporator or higher, most preferably to a temperature that is equal to or higher than the temperature of the evaporator 24. In an exemplary embodiment the evaporator 24, feed line 20a, valve 25 and filter 26 are heated to a temperature of about 100° C. In some embodiments, the processing chamber 30 may be a batch processing chamber, which may accommodate 20 or more, 50 or more, or 100 or more semiconductor substrates, which may be semiconductor wafers. In some other embodiments, the batch processing may be a single substrate processing chamber.

An inert gas, such as nitrogen, may be fed into the processing chamber 30 through gas feed lines 80, 80a from a source 8 of inert gas. Feed line 80 may include a manual valve 81, a pressure regulator 82, a pressure transducer 83, a filter 84, a flow controller 85 (with a valve 85a coupled to the flow controller 85), and a valve 86. Gas feed line 80a may be heated by a heater 88.

The inert gas may also be fed into the evaporator 24 through a gas feed line 50. Feed line 50 branches off from line 80 and may further comprise a check valve 52, a flow controller 53, and a valve 53a coupled to the flow controller 53. It will be appreciated that, as used herein, a line that "branches off" from another a line is in fluid communication with that other line.

The inert gas may also be fed through a gas feed line 60 to a point in line 20, between valves 21 and 22, to flow into and purge line 20. Line 60 branches off from line 80 and may include a pressure regulator 64, a pressure transducer 65, a flow restriction 61, a check valve 62, and a valve 63.

The inert gas may also be fed to the canister 15 through a gas feed line 70, to provide a driving pressure for the transport of the process liquid from the canister 15 into evaporator 24; the inert gas can provide positive pressure to push the process liquid from the canister 15 into the evaporator 24. The gas feed line 70 branches off from the gas feed line 60, downstream of the pressure transducer 65, and may include a flow restriction 71, a check valve 72, a valve 73, and a pressure transducer 74. Alternatively, in some embodiments, the process liquid may be driven from the canister 15 to the evaporator by gravity.

The processing system 200 may be further provided with drains 90, 90a and 90b to drain process liquid from the system 200, if needed. Drain 90 branches off from a point at first feed line 20, between the liquid flow controller 23 and the valve 23a and comprises a valve 91. Drain 90a branches off from feed line 20, directly above canister 15 and comprises valve 92. Drain 90b is at one end in direct communication with the interior of canister 15 and at the other end with drain 90. Drain 90b further comprises an overpressure relief valve 93. In a bypass line 96 around over pressure relief valve 93, valve 94 and flow restriction 95 are provided.

The drains 90, 90a and 90b may be free flow drains wherein the liquid is drained by the action of gravity. The free end of drain 90 is in communication with a drain system.

Preferably, the fluid lines that are in contact with process liquid, e.g., feed lines 10, 20, and 20a, and drains 90, 90a, and 90b, are made of a highly non-reactive polymer such as polytetrafluoroethylene (PTFE), perfluoroalkoxy alkane (PFA), or polyvinylidene difluoride (PVDF), or may be made of a similar, highly non-reactive material.

With continued reference to FIG. 1, the liquid flow controller 23 for controlling the liquid flow of the $H_2O_2/H_2O$ mixture is preferably a non-thermal flow controller. In some embodiments, the flow controller may be a Coriolis flow controller. In an experimental set-up a Bronkhorst M13 Coriolis flow controller was used. The Bronkhorst flow controller was configured to control a 30% $H_2O_2$ in $H_2O$ flow of 10 g/h to 1200 g/h. In the experimental set-up, the evaporator 24 was a Bronkhorst CEM (Controlled Evaporation Mixing) evaporator, but other commercially available evaporators that are suitable for the evaporation of process liquid may be used. The Bronkhorst M13 and Bronkhorst CEM are available from Bronkhorst High-Tech B.V. of Ruurlo, the Netherlands. As noted above, the evaporator was heated by the heater 28. A carrier gas flow was fed to this evaporator 24 through feed line 50 and mixed with the liquid flow to facilitate evaporation of the liquid. In the experimental set-up, feed line 20a was formed of SS 316L, but other high quality metals may be used that are customary for delivery systems of process gases and vapors to processing chambers. Alternatively, as noted herein, the feed line 20a may be formed of PTFE, PFE, or PVDF, or similar non-reactive material.

In the experimental set-up noted herein, the evaporator was operated under the following conditions:
  $H_2O_2$ concentration: 10% to 50%
  $H_2O_2/H_2O$ flow: 50 to 1000 g/h
  Carrier gas flow: 0.5 to 10 slm
  Reactor pressure 5 to 300 Torr
  Evaporator, filter and line temperature: less than 120° C.

In some experiments, particularly advantageous results were found within the following conditions:
  $H_2O_2$ concentration: 10% to 50%, or about 30%
  $H_2O_2/H_2O$ flow: 300 g/h to 500 g/h
  Carrier gas flow: 1 slm to 5 slm
  Reactor pressure 20 Torr to 120 Torr
  Evaporator, filter and line temperature: 100° C. or less, or 80° C. or less Advantageously, it has been found that evaporator temperatures below 120° C. resulted in higher $H_2O_2:H_2O$ ratios in the vapor mixture leaving the evaporator in comparison to evaporator temperatures of 120° C. and above. Converting the 30% (vol.) of $H_2O_2$ in the liquid to a concentration of $H_2O_2$ in the vapor phase, using the molecular weights of $H_2O_2$ (34) and $H_2O$ (16) and the specific densities of $H_2O_2$ (1.44 g/cm3) and $H_2O$ (1 g/cm$^3$) is believed to result in 25% (by vol.) of $H_2O_2$ in the vapor phase, assuming that no decomposition of the $H_2O_2$ takes place. In some embodiments, the amount of $H_2O_2$ in the vapor mixture may be about 20% (vol.) or more, or about 25% (vol.) or more. In other words, the volume percentage of $H_2O_2$ leaving the evaporator in the vapor phase may be within about 10% or within about 5% of the volume percentage of $H_2O_2$ in the liquid solution fed into the evaporator. Without wanting to be limited by theory, it is believed that evaporator temperatures of 120° C. or above result in significant decomposition of $H_2O_2$. Consequently, in some embodiments, for effective processing with $H_2O_2$, the temperature of the heated evaporator remains below 120° C., preferably about 110° C. or below, more preferably about 100° C. or below, and most preferably about 80° C. or below. In some embodiments, the evaporator temperature is in a range of about 120° C. to about 40° C., about 110° C. to about 50° C., about 100° C. to about 60° C., or about 80° C. to about 60° C.

It will be appreciated that such temperatures are lower than conventionally proposed temperatures of 200° C. or higher for curing processes with $H_2O_2$. Without wishing to be limited by theory, it is believed that the $H_2O_2/H_2O$ mixture is more susceptible to thermal decomposition in the liquid state than in the vapor phase. In some embodiments, after evaporation, the $H_2O_2/H_2O$ vapor may be exposed to higher temperatures and can be used for processing at about 100° C. to about 500° C., about 150° C. to about 450° C., or about 200° C. to 400° C.

Without wishing to be limited by theory, it is believed that reduction of the evaporator temperature to below 120° C. helped to avoid decomposition of $H_2O_2$. It will be appreciated that such a low or relatively low temperature for an evaporator is believed to be counter intuitive, as the energy needed for the evaporation of the liquid is thermal energy, which is provided by the temperature of the evaporator, with higher temperatures facilitating evaporation. Consequently, a reduction of the evaporator temperature would be expected to result in a slower evaporation process. Nevertheless, the evaporation temperatures disclosed herein may mitigate the decomposition of $H_2O_2$, which can provide an oxidizing ambient with good reactivity even with a slower evaporation process.

In addition, under some circumstances, depending on the flow of liquid material and the flow of carrier gas, it has been found that increased amounts of particles, relative to using a filter, were present on substrates processed in the reactor provided with a flow of $H_2O_2$. Without wishing to be limited by theory, it is believed that the particles are caused by small liquid droplets which are not completely evaporated and which are nevertheless carried from the evaporator to the processing chamber. The droplets may carry solid material to the reactor and in this way form a source of particles. Advantageously, it was found that providing a large area porous filter between the evaporator and the processing chamber, such as the filter 26 in the vapor feed line 29, mitigated and, in some cases, substantially eliminated the particles. Without wishing to be limited by theory, it is believed that the filter catches and evaporates droplets in the gas stream. In the experimental set-up a PTFE filter having a removal rating >3 nm was used.

In some embodiments, the filter may have a removal rating of >30 nm, >10 nm, or >3 nm. In some embodiments, the pore size of the filter may be about 5 μm or less, about 1 μm or less, or about 0.5 μm or less. In some embodiments, the filter may be a filter of PTFE, PFE or PVDA or similar non-reactive filter material. Alternatively, filter 26 may be a glass or quarts frit having a small pore size. In some embodiments, the frit may be part of a quartz injector for feeding the evaporated $H_2O_2/H_2O$ mixture into the processing chamber 30.

In some embodiments, instead of or in addition to using a filter, the residence time of the liquid/vapor mixture in the evaporator may be selected sufficiently long so that complete evaporation of the liquid occurs.

In some embodiments, in addition to the carrier gas flow through the evaporator, an additional nitrogen flow through the processing chamber can be applied at a flow rate of 0.01-1 slm.

It will be appreciated that various modifications may be made to the methods and systems disclosed herein. For example, the system and methods disclosed herein may be applied to provide a $H_2O_2$-containing oxidizing ambient for processes other than curing.

Accordingly, it will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A semiconductor processing system for processing semiconductor wafers, comprising: a batch processing chamber configured to accommodate 20 or more of the semiconductor wafers; a process canister for holding a H2O2/H2O mixture in a liquid state; an evaporator provided with an evaporator heater, the evaporator heater configured to heat the evaporator to a temperature lower than 120° C.; a first feed line for feeding the liquid H2O2/H2O mixture to the evaporator; a second feed line for feeding the evaporated H2O2/H2O mixture to the processing chamber, the second feed line provided with a second feed line heater configured to heat the second feed line to a temperature within 20° C. of the temperature of the evaporator; a filter in the second feed line, wherein the second feed line heater is configured to heat the second feed line and the filter to a temperature within 10° C. of the temperature of the evaporator; and a controller configured to cause the system to: load the 20 or more of the semiconductor wafers into the processing chamber; and oxidize the 20 or more of the semiconductor wafers in the processing chamber by flowing the evaporated H2O2/H2O mixture into the processing chamber.

2. The system of claim 1, wherein the filter in the second feed line has a removal rating of greater than 30 nm.

3. The system of claim 1, wherein the second feed line heater is configured to heat the second feed line and the filter to a temperature equal to the temperature of the evaporator.

4. The system of claim 1, wherein the evaporator heater is configured to heat the evaporator to a temperature of 100° C. or less.

5. The system of claim 4, wherein the evaporator heater is configured to heat the evaporator to a temperature of 80° C. or less.

6. The system of claim 1, further comprising a fluid flow controller in the first feed line, the fluid flow controller configured to control a flow of liquid from the process canister to the processing chamber.

7. The system of claim 6, wherein the fluid flow controller is a non-thermal flow controller.

8. The system of claim 7, wherein the fluid flow controller is a Coriolis flow controller.

9. The system of claim 1, wherein the controller is programmed to provide instructions to:
  heat the evaporator to a temperature lower than 120° C.; and
  heat the second feed line to the temperature within 20° C. of the temperature of the evaporator or to the temperature higher than the temperature of the evaporator.

10. The system of claim 1, wherein the system is configured to maintain a processing chamber pressure of 5 to 300 Torr while feeding the evaporated H2O2/H2O mixture into the processing chamber.

11. The system of claim 10, wherein the processing chamber pressure is 20 to 120 Torr.

* * * * *

UNITED STATES PATENT AND TRADEMARK OFFICE
CERTIFICATE OF CORRECTION

PATENT NO. : 10,343,907 B2  
APPLICATION NO. : 14/660789  
DATED : July 9, 2019  
INVENTOR(S) : Bert Jongbloed et al.

Page 1 of 1

It is certified that error appears in the above-identified patent and that said Letters Patent is hereby corrected as shown below:

In the Specification

In Column 5, Line 25, change "less" to --less.--.

In the Claims

In Column 6, Line 67, Claim 1, change "H2O2/H2O" to --$H_2O_2/H_2O$--.

In Column 7, Line 3, Claim 1, change "H2O2/H2O" to --$H_2O_2/H_2O$--.

In Column 7, Line 5, Claim 1, change "H2O2/H2O" to --$H_2O_2/H_2O$--.

In Column 7, Lines 15-16 (Approx.), Claim 1, change "H2O2/H2O" to --$H_2O_2/H_2O$--.

In Column 8, Line 21 (Approx.), Claim 10, change "H2O2/H2O" to --$H_2O_2/H_2O$--.

Signed and Sealed this  
Thirty-first Day of December, 2019

Andrei Iancu  
*Director of the United States Patent and Trademark Office*